United States Patent
Lee et al.

(10) Patent No.: US 7,507,624 B2
(45) Date of Patent: Mar. 24, 2009

(54) SEMICONDUCTOR MEMORY DEVICE AND METHOD OF MANUFACTURING THE SAME

(75) Inventors: Euhn-Gi Lee, Yongin-si (KR);
Bong-Jun Jang, Hwaseong-si (KR);
Sung-Woon Yun, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 11/432,118

(22) Filed: May 11, 2006

(65) Prior Publication Data

US 2006/0258099 A1 Nov. 16, 2006

(30) Foreign Application Priority Data

May 11, 2005 (KR) .................. 10-2005-0039430

(51) Int. Cl.
*H01L 21/336* (2006.01)
(52) U.S. Cl. .................. 438/257; 438/258; 438/286; 257/E21.179; 257/E21.422; 257/E21.68
(58) Field of Classification Search .................. 438/257, 438/626, 952, 286; 257/639, 315, E21.179, 257/E21.422, E21.68
See application file for complete search history.

(56) References Cited

U.S. PATENT DOCUMENTS

| | | | | |
|---|---|---|---|---|
| 6,072,241 A * | 6/2000 | Kojima | ........................ | 257/752 |
| 6,153,541 A | 11/2000 | Yao et al. | ..................... | 438/786 |
| 6,232,185 B1 * | 5/2001 | Wang | .......................... | 438/266 |
| 6,437,424 B1 * | 8/2002 | Noma et al. | ................. | 257/639 |
| 6,452,225 B1 * | 9/2002 | Yang et al. | ................... | 257/315 |
| 6,486,506 B1 * | 11/2002 | Park et al. | ..................... | 257/314 |
| 6,784,094 B2 | 8/2004 | Yin et al. | ..................... | 438/636 |
| 6,797,650 B1 * | 9/2004 | Wang et al. | .................. | 438/786 |
| 2002/0163032 A1 * | 11/2002 | Lin et al. | ..................... | 257/315 |

FOREIGN PATENT DOCUMENTS

KR     2003-0090119     11/2003

* cited by examiner

*Primary Examiner*—Asok K Sarkar
(74) *Attorney, Agent, or Firm*—F. Chau & Associates, LLC

(57) ABSTRACT

A method of manufacturing a semiconductor memory device is provided. The method includes: providing a semiconductor substrate, forming a cell transistor on the semiconductor substrate, and forming a SiON layer with a refractive index of about 1.8 or less on the cell transistor.

18 Claims, 8 Drawing Sheets

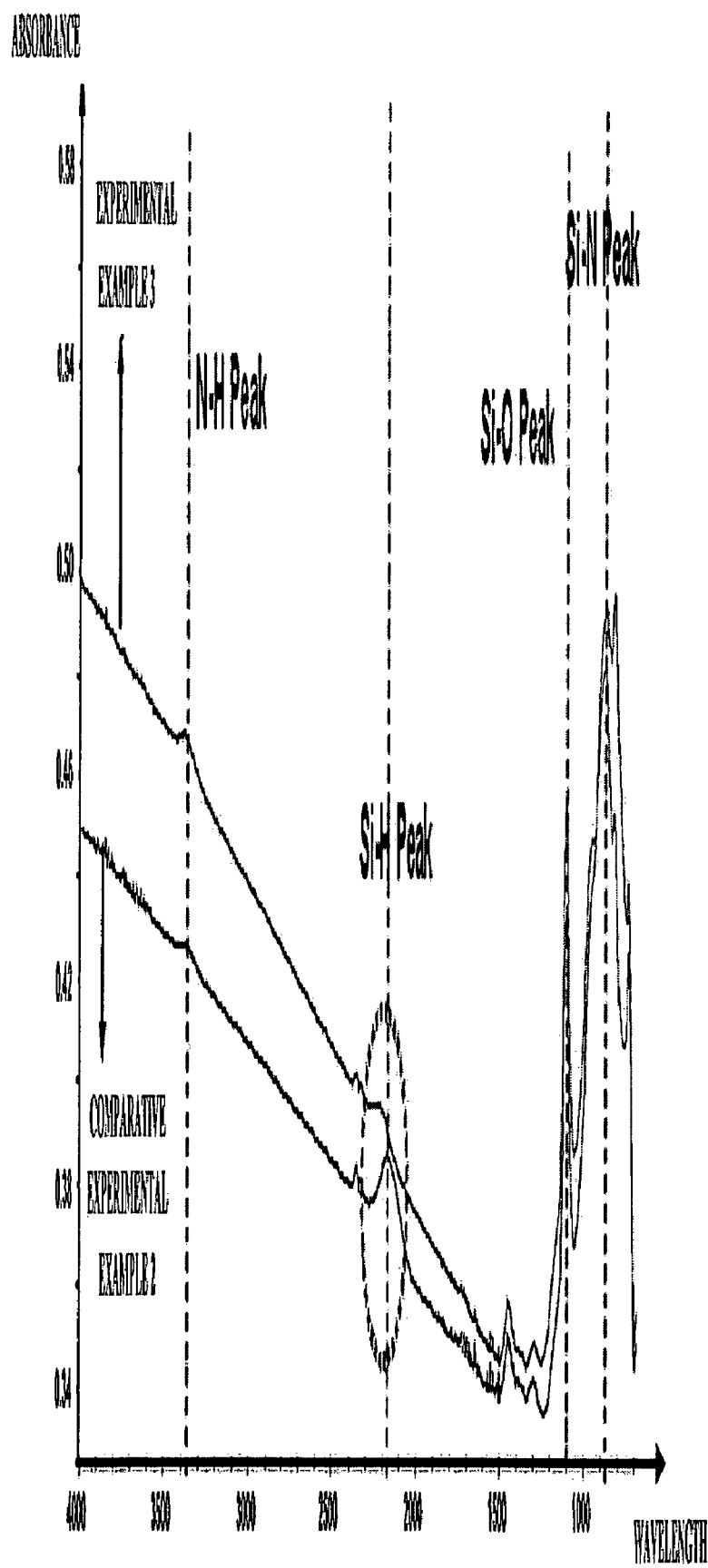

SEMICONDUCTOR MEMORY DEVICE AND METHOD OF MANUFACTURING THE SAME

CROSS-REFERENCE TO RELATED PATENT APPLICATION

This application claims priority from Korean Patent Application No. 10-2005-0039430 filed on May 11, 2005, in the Korean Intellectual Property Office, the disclosure of which is incorporated by reference herein in its entirety.

FIELD OF THE INVENTION

The present invention relates to a semiconductor memory device and a method of manufacturing the semiconductor memory device. More particularly, the present invention relates to a semiconductor memory device with enhanced reliability and a method of manufacturing the semiconductor memory device.

DESCRIPTION OF THE RELATED ART

When forming a semiconductor memory device, a silicon oxynitride (SiON) layer may be formed on a cell transistor and used in various applications. For example, the SiON layer serves as an antireflective layer in a photolithography process due to its diffused-reflection preventive property, and also as an etch stop layer in an etching process due to its low etch rate for an oxide layer (e.g., $SiO_2$).

The SiON layer is typically formed using silane ($SiH_4$), ammonia ($NH_3$), nitrous oxide ($N_2O$), or nitrogen ($N_2$), and thus contains many Si—H bonds. Such Si—H bonds are readily dissociated even at a low temperature, yielding ion species that can readily attract charges. Thus, the Si—H bonds also serve to capture floating charges in a semiconductor memory device so that a cell transistor is not affected by the floating charges.

A cell transistor of a nonvolatile memory device such as a flash device, EEPROM (Electrically Erasable Programmable Read Only Memory), and EPROM (Erasable and Programmable Read Only Memory) store charges during a predetermined time. However, when a SiON layer is formed on the cell transistor of the nonvolatile memory device, attraction of stored charges in the cell transistor to the SiON layer occurs due to the presence of Si—H bonds in the SiON layer, thereby leading to leakage current. Consequently, the retention characteristics of the nonvolatile memory device are degraded, and the reliability of the nonvolatile memory device under an elevated pressure may also be lowered.

Thus, there is a need for a semiconductor memory device and to a method of forming the same, wherein the retention characteristics of electrons stored in a cell transistor of the semiconductor memory device are enhanced and the reliability of the semiconductor memory device is also enhanced in comparison to conventional semiconductor memory devices

SUMMARY OF THE INVENTION

According to an exemplary embodiment of the present invention, a method of manufacturing a semiconductor memory device is provided. The method includes: providing a semiconductor substrate, forming a cell transistor on the semiconductor substrate, and forming a SiON layer with a refractive index of about 1.8 or less on the cell transistor.

According to another exemplary embodiment of the present invention, a semiconductor memory device is provided. The semiconductor memory device includes a semiconductor substrate, a cell transistor formed on the semiconductor substrate, and a SiON layer formed on the cell transistor having a refractive index of about 1.8 or less.

BRIEF DESCRIPTION OF THE DRAWINGS

FIG. 3 is a view illustrating the measurements of absorbance with respect to wavelength for a semiconductor memory device manufactured according to an exemplary embodiment of the present invention;

DETAILED DESCRIPTION OF THE EXEMPLARY EMBODIMENTS OF THE INVENTION

Exemplary embodiments of the present invention will now be described more fully with reference to the accompanying drawings. The present invention may, however, be embodied in many different forms and should not be construed as being limited to the exemplary embodiments set forth herein.

A method of manufacturing a semiconductor memory device according to an exemplary embodiment of the present invention will now be described with reference to FIGS. 1A through 1G. For example, the semiconductor memory device of the present exemplary embodiment shown in FIGS. 1A through 1G is a split gate-type flash memory device.

Figure 1A:
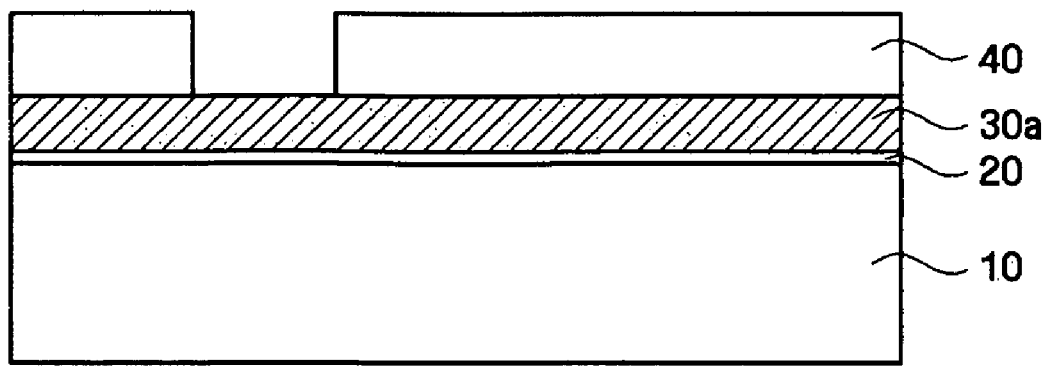
FIGS. 1A through 1G are sectional views illustrating a method of manufacturing a semiconductor memory device according to an exemplary embodiment of the present invention.

Referring first to FIG. 1A, a semiconductor substrate 10 is provided. For example, the semiconductor substrate may be a silicon substrate, SOI (silicon on insulator), Ga—As (Gallium-Arsenide) substrate, Si—Ge (Silicon Geranium) substrate, ceramic substrate, quartz substrate, or glass substrate for a display device.

Moreover, a device isolation region may be formed on the semiconductor substrate 10. The device isolation region may be a field oxide (FOX) or shallow trench isolation (STI) region formed by a local oxidation of silicon (LOCOS) method.

Then, a first gate insulating layer 20, a conductive layer 30a for a floating gate, and an antioxidative layer are sequentially formed on the semiconductor substrate 10. Next, the antioxidative layer is patterned by dry-etching to form an antioxidative layer pattern 40 exposing a region intended for floating gate formation.

Here, the first gate insulating layer 20 may be formed to a thickness of about 30 to about 150 angstroms (Å) using the following materials including but not limited to silicon dioxide ($SiO_2$), silicon oxynitride (SiON), silicon nitride ($Si_3N_4$), geranium oxynitrides ($Ge_xO_yN_z$), geranium silicon oxides ($Ge_xSi_yO_z$), a high dielectric constant (high-k) material, or the like. The first gate insulating layer 20 may also be made of a combination of the illustrated materials. For example, the first gate insulating layer 20 may be a stacked structure obtained by sequentially stacking two or more materials selected from the illustrated materials. The high-k material may be made from the following materials including but not limited to hafnium oxide ($HfO_2$), zirconium oxide ($ZrO_2$), aluminum oxide ($Al_2O_3$), tantalum oxide ($Ta_2O_5$), hafnium silicate, zirconium silicate, or a combination thereof, and may be deposited by an atomic layer deposition process. Also, as the thickness of the first gate insulating layer 20 is reduced, a higher-k material should be used.

The conductive layer 30a for the floating gate may be formed to a thickness of 100 to 300 Å using polysilicon, impurity doped polysilicon, or a metallic conductive material. Here, the metallic conductive material may be made from the following materials including but not limited to tantalum nitride (TaN), nickel tantalum (NiTa), titanium (Ti), titanium nitride (TiN), tantalum (Ta), tungsten (W), tungsten nitride (WN), hafnium (Hf), niobium (Nb), molybdenum (Mo), ruthenium oxide ($RuO_2$), molybdenum nitride ($Mo_2N$), iridium (Ir), platinum (Pt), cobalt (Co), chromium (Cr), ruthenium oxide (RuO), tungsten nitride (WNx), or a combination thereof.

In addition, the antioxidative layer pattern 40 prevents a region except an upper portion of a floating gate from being oxidized in a subsequent oxidation process. For example, the antioxidative layer pattern 40 may be made of nitride and formed to a thickness of about 100 to 1,000 Å.

Figure 1B:
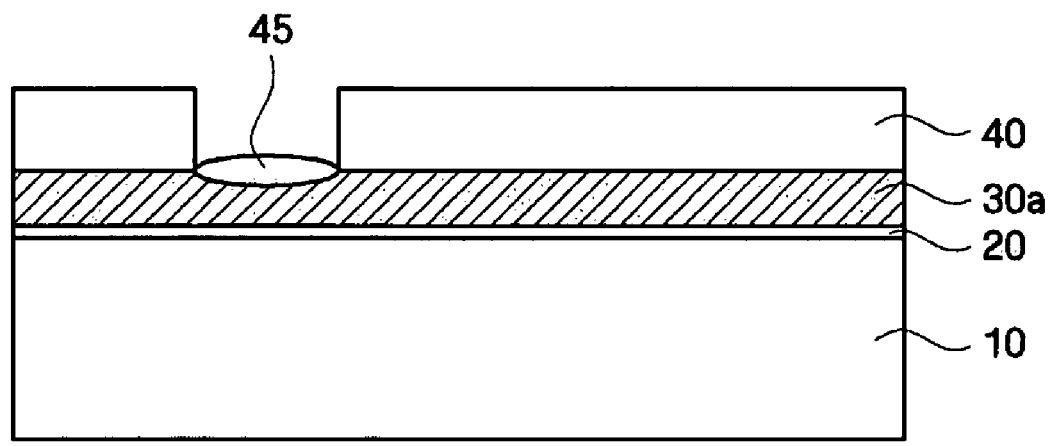

Referring to FIG. 1B, a region exposed by the antioxidative layer pattern 40 is then thermally oxidized to form an inter-gate insulating layer 45. The inter-gate insulating layer 45 can serve as an etching mask in a subsequent etching process, and the central portion of the inter-gate insulating layer 45 may be formed to a thickness of about 20 to about 200 Å. Here, a lower edge of the inter-gate insulating layer 45 is rounded.

Figure 1C:
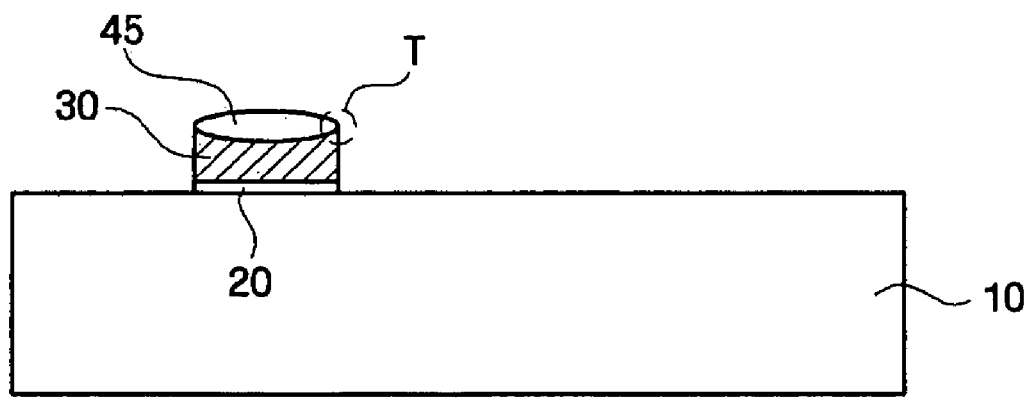

Referring to FIG. 1C, the antioxidative layer pattern 40 (see FIG. 1B), the conductive layer 30a (see FIG. 1B) for the floating gate, and the first gate insulating layer 20 are etched using the inter-gate insulating layer 45 as an etching mask to form a floating gate 30. Moreover, since the lower edge of the inter-gate insulating layer 45 is rounded, a sidewall of the floating gate 30 may be formed with a tip T accordingly. The tip T can increase an F-N (Fowler Nordheim) tunneling effect between the floating gate 30 and a control gate, which will be described below.

Figure 1D:
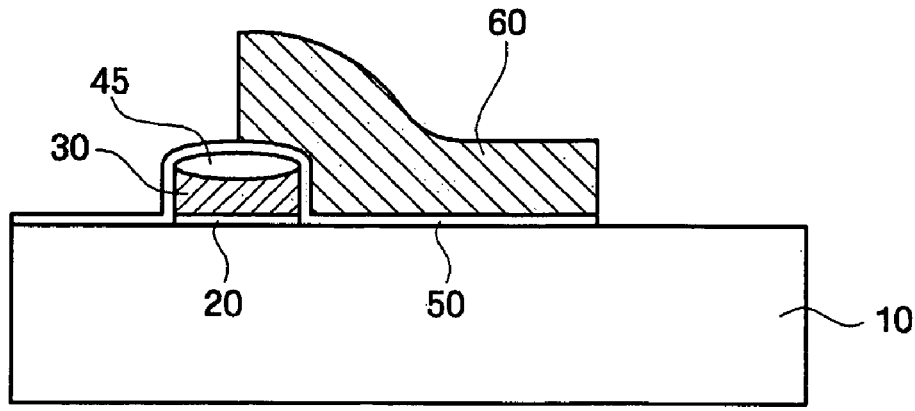

Referring to FIG. 1D, a second gate insulating layer 50 and a conductive layer for a control gate are sequentially stacked on the semiconductor substrate 10. Here, the second gate insulating layer 50 may be formed of an oxide by a thermal treatment process to a thickness of about 70 to about 150 Å. In addition, the second gate insulating layer 50 may be formed of a single layer made of the following materials including but not limited to $SiO_2$, SiON, $Si_3N_4$, $Ge_xO_yN_z$, $Ge_xSi_yO_z$, or a high dielectric constant (high-k) material, or a stacked structure obtained by sequentially stacking two or more materials selected from the above-mentioned materials.

The conductive layer 30a for the floating gate may be formed using low pressure chemical vapor deposition (LPCVD). Here, the conductive layer 30a for the floating gate may be formed of polysilicon, impurity doped polysilicon, or a metallic conductive material. The metallic conductive layer may be formed of a single layer made of the following materials including but not limited to TaN, NiTa, Ti, TiN, Ta, W, WN, Hf, Nb, Mo, $RuO_2$, Ir, Pt, Co, Cr, RuO, $Mo_2N$, WNx, or a combination thereof, or a stacked structure obtained by sequentially stacking polysilicon and impurity doped polysilicon.

Then, the conductive layer for the control gate is dry-etched to form a control gate 60.

Figure 1E:
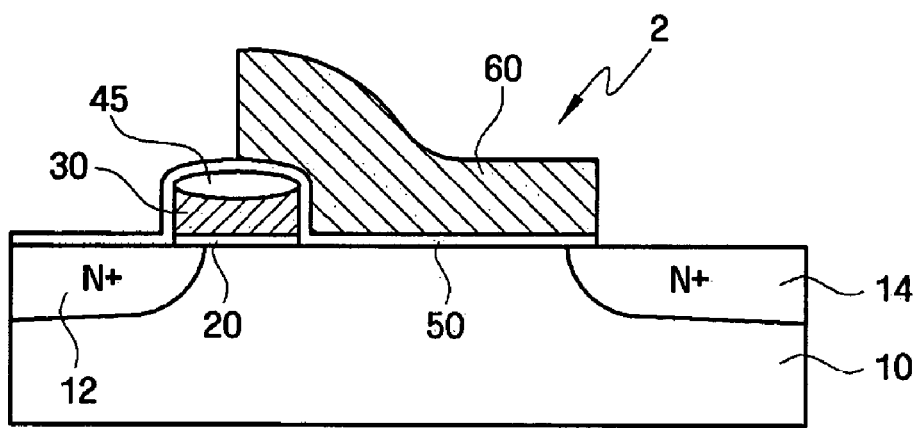

Referring to FIG. 1E, a high-concentration impurity is doped into the semiconductor substrate 10 to form a source region 12 aligned to one sidewall of the floating gate 30. The source region 12 may extend to partially overlap with the floating gate 30 in a subsequent thermal treatment process. In addition, a high-concentration impurity is doped into the semiconductor substrate 10 to form a drain region 14 aligned to one sidewall of the control gate 60. The drain region 14 may also extend to partially overlap with the control gate 60 in a subsequent thermal treatment process.

There is no specific requirement as to the order of the formation sequence for the source region 12 and the drain region 14. While the source region 12 and the drain region 14 are formed, the control gate 60 may be doped with a high concentration impurity. The drain region 14 serves as a bit line junction contacting with a bit line (see 90 of FIG. 1G).

Figure 1F:
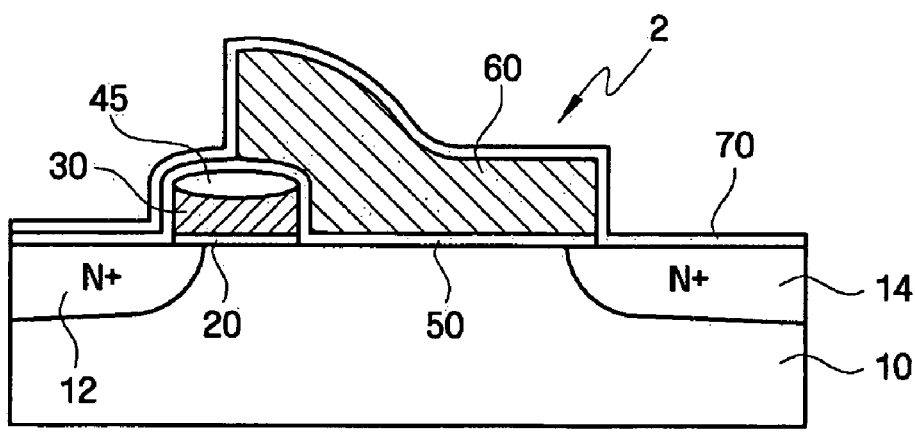

Referring to FIG. 1F, a SiON layer 70 with a refractive index (RI) of about 1.8 or less is formed on the semiconductor substrate 10. In the SiON layer 70, the ratio of Si—H bond to Si—O bond may be about 5% or less. Here, the SiON layer 70 may be formed to a thickness of about 150 to about 600 Å by PECVD (Plasma Enhanced Chemical Vapor Deposition).

A process for forming the SiON layer 70 will now be described in more detail. $SiH_4$, $N_2O$, $NH_3$, and $N_2$ gases are supplied in a reaction chamber at a temperature of about 300 to about 450° C. under a pressure of about 2 to 3 torr. Here, the $SiH_4$ gas is used as a silicon source gas, the $N_2O$ gas is used as an oxygen source gas, the $NH_3$ gas is used as a nitrogen source gas, and the $N_2$ gas is used for pressure adjustment. Then, RF power is turned-on and a power of about 80 to about 150 watts (W) is applied to form the SiON layer 70. The SiON layer 70 is formed based on the following reaction scheme:

$$SiH_4 + N_2O + NH_3 + N_2 \rightarrow SiON$$

The flow-rate ratio of the $SiH_4$ gas to the $N_2O$ gas may be about 0.5:1 or less. In the SiON layer 70, the ratio of Si—H bond to Si—O bond may be reduced to about 5% or less. Since Si—H bonds are readily dissociated even at a low temperature to yield ion species which readily attract charges, attraction of programmed electrons from the floating gate 30 to the SiON layer 70 may occur, thereby causing leakage current. In this regard, the reduction of the flow rate of the $SiH_4$ gas that can be used as a hydrogen source allows for the reduction of the Si—H bond content. For example, the $SiH_4$ gas may be supplied at a flow rate of about 30 to about 100 standard cubic centimeters per minute (sccm). That is, when the flow-rate ratio of the $SiH_4$ gas to the $N_2O$ gas is about 0.4:1, the $SiH_4$ and the $N_2O$ gases may be supplied at a rate of about 50 sccm and about 120 sccm, respectively. However, the flow rates of the $SiH_4$ and $N_2O$ gases may vary according to the type of PECVD machine used.

In addition, $NH_3$ gas is not readily dissociated but can also produce some Si—H bonds. Thus, the flow-rate ratio of the $SiH_4$ gas to the $N_2O$ gas may be about 0.5:1 or less. When taking into account the flow rate of the $NH_3$ gas, the flow-rate ratio of a mixed gas of the $SiH_4$ gas and the $NH_3$ gas to the $N_2O$ gas may be about 0.8:1 or less. For example, when the flow-rate ratio of the mixed gas of the $SiH_4$ gas and the $NH_3$ gas to the $N_2O$ gas is about 0.66:1, the $SiH_4$ gas, the $NH_3$ gas, and the $N_2O$ gas may be supplied at a rate of about 50 sccm, about 120 sccm, and about 120 sccm, respectively. However, the flow rates of the $SiH_4$ gas, the $NH_3$ gas, and the $N_2O$ gas may vary according to the type of PECVD machine used.

Figure 1G:
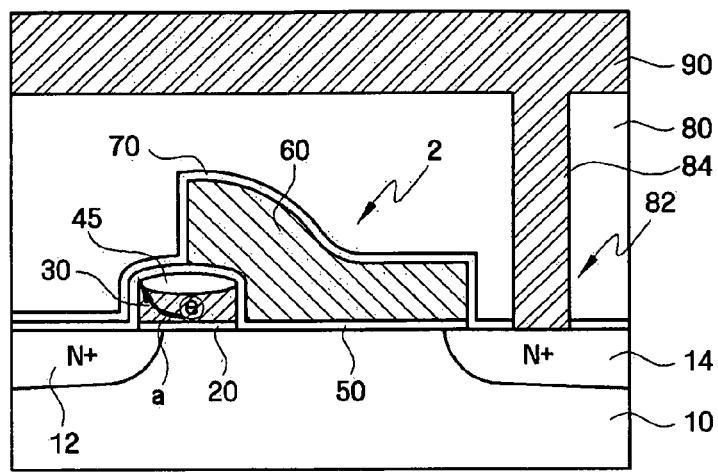

Referring to FIG. 1G, a gate-to-metal interlayer 80 is formed on the semiconductor substrate 10 and a predetermined region of the gate-to-metal interlayer 80 is dry-etched to form a contact hole 82. Here, when the predetermined region of the gate-to-metal interlayer 80 is dry-etched, the SiON layer 70 is used as an antireflective layer and/or an etch stop layer.

Then, a conductive material such as metal is deposited and patterned so that the contact hole 82 is sufficiently filled to thereby form a bit line contact 84 and a bit line 90.

As shown in FIG. 1G, the semiconductor memory device according to an exemplary embodiment of the present invention includes a semiconductor substrate 10, a cell transistor 2, a SiON layer 70, a gate-to-metal interlayer 80, and a bit line 90.

Additionally, a device isolation region may be formed on the semiconductor substrate 10 to define an active region.

The cell transistor 2 is formed on the semiconductor substrate 10. A plurality of cell transistors constitute a memory array. The cell transistor 2 includes a first gate insulating layer 20, a floating gate 30, an inter-gate insulating layer 45, a second gate insulating layer 50, a control gate 60, a source region 12, and a drain region 14.

The first gate insulating layer 20 is formed below the floating gate 30, and transfers a voltage applied to the source region 12 to the floating gate 30 by coupling the voltage to the floating gate 30 during programming. Thus, hot electrons that move from the source region 12 to the drain region 14 during programming are accumulated in the floating gate 30 via the first gate insulating layer 20. The first gate insulating layer 20 may be formed to a thickness of about 30 to about 150 Å using the following materials including but not limited to $SiO_2$, SiON, $Si_3N_4$, $Ge_xO_yN_z$, $Ge_xSi_yO_z$, a high-k material, or a combination thereof.

The floating gate 30 is formed on the first gate insulating layer 20, and stores electrons during programming. Also, since the lower edge of the inter-gate insulating layer 45 is rounded, the floating gate 30 may be formed with a tip (see T of FIG. 1C) at its sidewall meeting with the inter-gate insulating layer 45. Since an electric field is concentrated on the tip of the floating gate 30, low-voltage FN tunneling may be induced during erasing of a nonvolatile memory device. The floating gate 30 may be formed to a thickness of about 100 to about 300 Å as a layer made of the following material including but not limited to polysilicon, impurity doped polysilicon, a metallic conductive material, or the like.

The control gate 60 is disposed above the floating gate 30 and extends to the semiconductor substrate 10 along a sidewall of the floating gate 30. The control gate 60 is formed insulatingly from the floating gate 30 and the semiconductor substrate 10. The second gate insulating layer 50 is formed between the floating gate 30 and the control gate 60 to electrically insulate the control gate 60 and the floating gate 30. Electrons stored in the floating gate 30 are emitted into the control gate 60 via the second gate insulating layer 50 by FN tunneling during erasing.

The source region 12 is aligned to a sidewall of the floating gate 30 that does not overlap with the control gate 60 and formed in the semiconductor substrate 10 by ion implantation with a high concentration impurity. The drain region 14 is aligned to the control gate 60 above the semiconductor substrate 10 and formed in the semiconductor substrate 10 by ion implantation with a high concentration impurity. Moreover, semiconductor memory devices may also be formed in pairs to share the source region 12. Consequently, the whole size of a memory array made up of semiconductor memory devices can be efficiently reduced.

The SiON layer 70 is formed on the cell transistor 2, and used as an antireflective layer and/or an etch stop layer. As the design rule of a semiconductor memory device is reduced, the reflectivity of an underlying layer of the control gate 60 may increase, thereby causing pattern non-uniformity. Thus, the SiON layer 70 serves to reduce the reflectivity of the underlying layer. The SiON layer 70 is also used to accurately define an etch depth when the contact hole 82 is formed in the gate-to-metal interlayer 80.

The SiON layer 70 has a refractive index (RI) of about 1.8 or less. The refractive index is defined by the following equation. Here, Vv (Vacuum Velocity) is the velocity of light in a vacuum, and Vs (Substrate Velocity) is the velocity of light in a medium. Thus, the refractive index is generally more than 1. The higher the refractive index, the higher the density of the medium.

$$RI = \frac{Vv}{Vs} > 1$$

The refractive index of a conventional SiON layer is about 2.02 to 2.03. A SiON layer with a refractive index of 2 or more is formed when the flow-rate ratio of $SiH_4$ gas to $N_2O$ gas is 1 or more. According to FTIR (Fourrier transformation infrared) analysis for the conventional SiON layer, the ratio of Si—H bond to Si—O bond is about 10%. With such a high ratio of Si—H bonds to Si—O bonds, this forces electrons stored in a floating gate during programming to become attracted to the SiON layer, thereby causing, leakage current to occur. As a result, the retention characteristics of a cell transistor are likely to be lowered. In addition, it is difficult to adjust the specification of an initial voltage and a voltage difference (a difference between the initial voltage and a voltage after baking) of a semiconductor memory device.

Meanwhile, according to the above-described exemplary embodiment of the present invention, the refractive index of the SiON layer 70 is about 1.8 or less. In this case, the ratio of Si—H bond to Si—O bond may be about 5% or less. Considering that the refractive index of a SiN layer is 2.05 and the refractive index of a $SiO_2$ layer is 1.46, it can be said that the SiON layer 70 of the present exemplary embodiment more closely approximates the characteristics of a $SiO_2$ layer, relative to a conventional SiON layer. In addition, since the ratio of Si—H bond to Si—O bond is about 5% or less, attraction of electrons stored in the floating gate 30 to the SiON layer 70 is reduced (see arrow a of FIG. 1G). Therefore, leakage current decreases and the retention characteristics of the cell transistor 2 are enhanced.

A method of manufacturing a semiconductor memory device according to another exemplary embodiment of the present invention will now be described with reference to FIGS. 2A through 2G. The semiconductor memory device of the exemplary embodiment depicted in FIGS. 2A through 2G is a floating gate tunnel oxide (FLOTOX) type EEPROM.

Figure 2A:
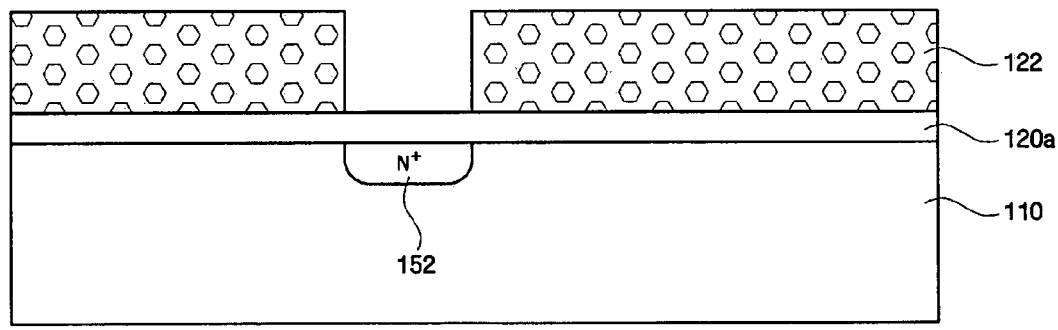
FIGS. 2A through 2G are sectional views illustrating a method of manufacturing a semiconductor memory device according to an exemplary embodiment of the present invention.

Referring to FIG. 2A, a device isolation region is formed on a semiconductor substrate 110 to define an active region.

Then, a gate insulating layer 120a is formed on the semiconductor substrate 110. The gate insulating layer 120a is a $SiO_2$ layer and may be formed to a thickness of about 200 to about 500 Å.

A photoresist layer pattern 122 is formed on the gate insulating layer 120a to expose a region intended for forming a channel region. An $N^+$ type high-concentration impurity region 152 for the channel region is formed by ion implantation using the photoresist layer pattern 122 as an ion implantation mask. Here, the ion implantation may be performed using phosphorus (P) ions with an implantation energy of about 40 to about 100 keV at a dose of about $1\times10^{13}$ to about $1\times10^{14}$ atoms/cm$^2$.

Then, the photoresist layer pattern 122 is removed.

Figure 2B:
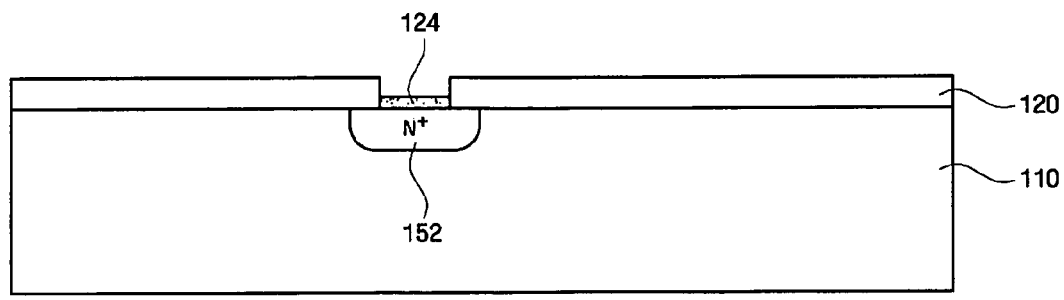

Referring to FIG. 2B, the gate insulating layer 120a (see FIG. 2A) is patterned to form a gate insulating layer pattern 120 exposing a predetermined region of the semiconductor substrate 110.

Then, a tunneling insulating layer 124 is formed on the exposed region of the semiconductor substrate 110. Here, the tunneling insulating layer 124 may be made of the following material including but not limited to $SiO_2$, SiON, $Si_3N_4$, $Ge_xO_yN_z$, $Ge_xSi_yO_z$, a high-k material, or a combination thereof. The tunneling insulating layer 124 has a thinner thickness than the gate insulating layer pattern 120. That is, the tunneling insulating layer 124 may have a thickness of about 5 to about 100 Å, and more preferably about 5 to about 50 Å.

Figure 2C:
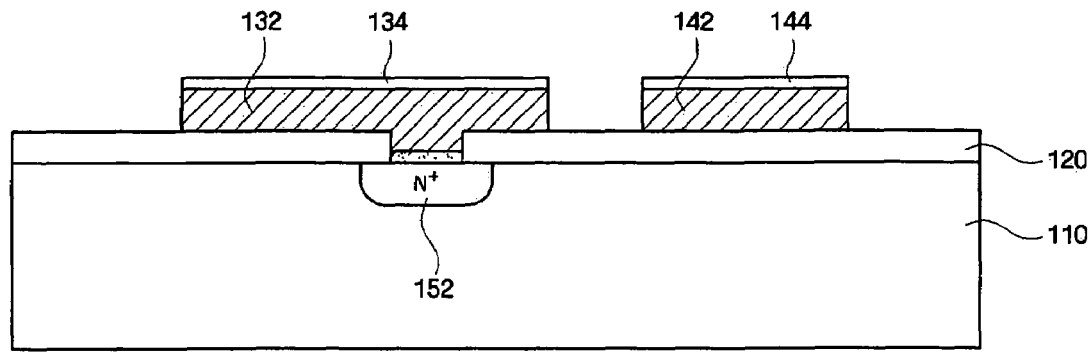

Referring to FIG. 2C, a conductive layer for a floating gate and an insulating layer are sequentially formed on the gate insulating layer pattern 120, followed by patterning, to form floating gates 132 and 142 and inter-gate insulating layers 134 and 144 for a memory transistor and a select transistor, respectively.

Here, the conductive layer for the floating gate 30a may be formed to a thickness of about 100 to about 300 Å using polysilicon, impurity doped polysilicon, or a metallic conductive material. The inter-gate insulating layers may be formed to a thickness of about 70 to about 150 Å, and the metallic conductive material may be made from the following materials including but not limited to TaN, NiTa, Ti, TiN, Ta, W, WN, Hf, Nb, Mo, $RuO_2$, $Mo_2N$, Ir, Pt, Co, Cr, RuO, $Mo_2N$, WNx, or a combination thereof.

Figure 2D:
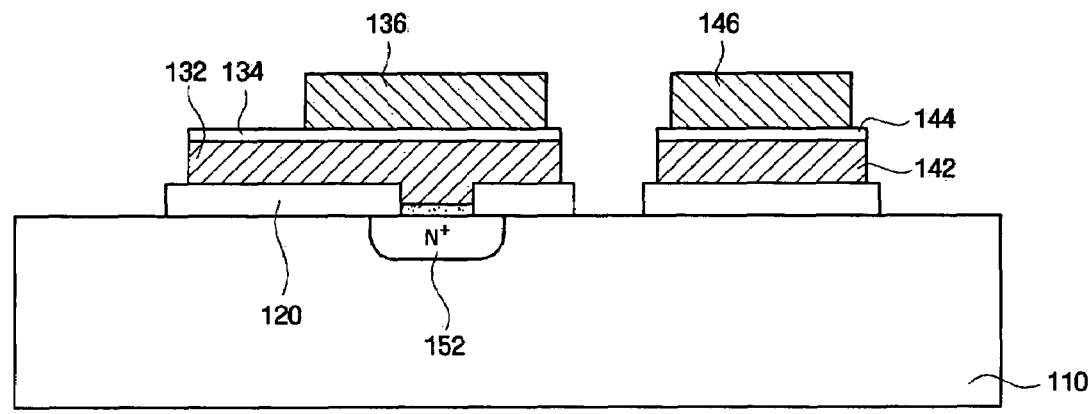

Referring to FIG. 2D, a conductive layer for a line is conformally formed on the floating gates 132 and 142 and the inter-gate insulating layers 134 and 144 for the memory transistor and the select transistor, respectively, followed by patterning, to form a sense line 136 for the memory transistor and a word line 146 for the select transistor. Here, the widths of the sense line 136 and the word line 146 may be narrower than those of the floating gates 132 and 142.

In the present exemplary embodiment, the floating gates 132 and 142, the sense line 136, and the word line 146 are separately formed. However, the floating gates 132 and 142, the sense line 136, and the word line 146 may also be formed at the same time by sequentially forming a conductive layer for the floating gates, an inter-gate insulating layer, and a conductive layer for the lines followed by patterning. In this case, the widths of the sense line 136 and the word line 146 are substantially the same as those of the floating gates 132 and 142.

Figure 2E:
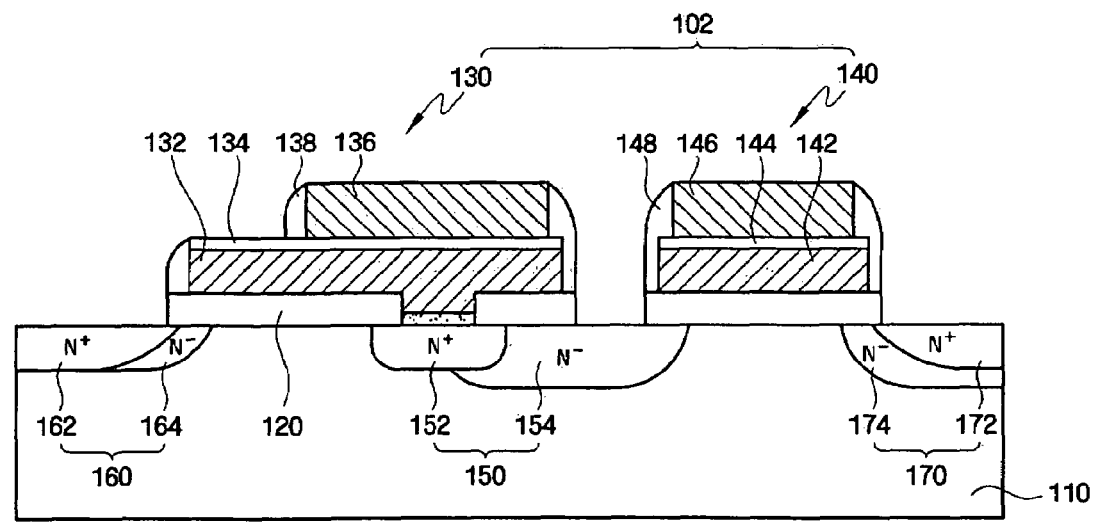

Referring to FIG. 2E, first, second, and third impurity regions 150, 160, and 170 are formed to complete a cell transistor 102 of a semiconductor memory device. In i this exemplary embodiment, the cell transistor 102 includes both a memory transistor 130 and a select transistor 140.

For example, a low-concentration impurity is doped into the semiconductor substrate 110 having thereon the memory transistor 130 and the select transistor 140 using an ion implantation mask masking the second impurity region 160 to form a first low-concentration impurity region 154 of the first impurity region 150 and a third low-concentration impurity region 174 of the third impurity region 170. Here, the first impurity region 150 serves as a channel region and the third impurity region 170 serves as a drain region. Here, the ion implantation is performed using phosphorus ions with implantation energy of about 80 to about 90 keV at a dose of about $1.0\times10^{12}$ to about $5.0\times10^{13}$ atoms/cm$^2$. The first and third low-concentration regions 154 and 174 formed under the above injection conditions are designated high-voltage n-type (HVN) regions.

Next, a low-concentration impurity is doped into the semiconductor substrate 110 using an ion implantation mask masking the first and third impurity regions 150 and 170 to form a second low-concentration impurity region 164 of the second impurity region 160 which is separated from the first impurity region 150 by a predetermined distance and aligned to a sidewall of the memory transistor 130. Here, the second impurity region 160 serves as a source region. The ion implantation is performed using phosphorus or arsenic ions with implantation energy of about 30 to about 80 keV at a dose of about $1.0\times10^{12}$ to about $1.0\times10^{13}$ atoms/cm$^2$. The second low-concentration impurity region 164 formed under the above injection conditions is designated low-voltage n-type (LVN) region.

Next, an insulating layer for a spacer is deposited on the entire surface of the semiconductor substrate 110 and etch-backed to form spacers 138 and 148 on sidewalls of the memory transistor 130 and the select transistor 140, respectively.

Next, a high-concentration impurity is doped into the semiconductor substrate 110 using an ion implantation mask masking the first impurity region 150 to form a second high-concentration impurity region 162 of the second impurity region 160 and a third high-concentration impurity region 172 of the third impurity region 170. Here, the ion implantation is performed using arsenic ions with implantation energy of about 40 to about 60 keV at a dose of about $1.0\times10^{15}$ to about $5.0\times10^{15}$ atoms/cm$^2$.

When the first, second, and third impurity regions 150, 160, and 170 are formed as described above, the second impurity region 160 has a LDD (Lightly Doped Drain) structure and the third impurity region 170 has a DDD (Double Diffused Drain) structure, but the exemplary embodiments of the present invention are not limited thereto.

Figure 2F:
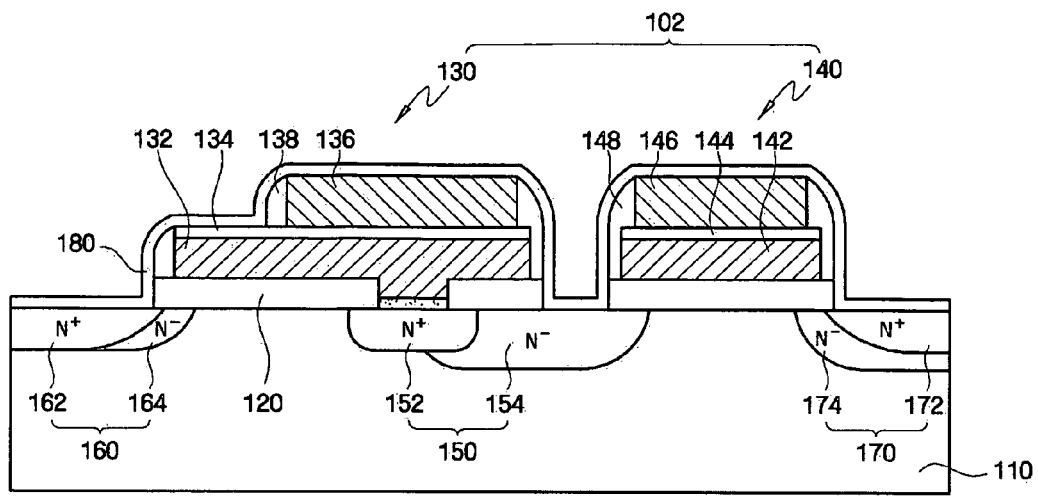

Referring to FIG. 2F, a SiON layer 180 with refractive index of about 1.8 or less is formed on the semiconductor substrate 110. Here, the SiON layer 180 may be formed to a thickness of about 150 to about 600 Å by PECVD. If the refractive index of the SiON layer 180 is more than 1.8, a significant number of Si—H bonds may be contained in the SiON layer 180, and thus, attraction of electrons stored in the floating gate 132 of the memory transistor 130 to the SiON layer 180 may occur, thereby causing leakage current.

The forming process of the SiON layer 180 is substantially the same as that of the exemplary embodiment of the present invention shown in FIGS. 1A through 1G. That is, the flow-rate ratio of the $SiH_4$ gas to the $N_2O$ gas may be about 0.5:1 or less. In the SiON layer 70, the ratio of Si—H bond to Si—O bond may be reduced to about 5% or less. Meanwhile, the $NH_3$ gas is not readily dissociated but can also produce some Si—H bonds. Thus, the flow-rate ratio of the $SiH_4$ gas to the $N_2O$ gas may be about 0.5:1 or less. When taking into account the flow rate of the $NH_3$ gas, the flow-rate ratio of a mixed gas of the $SiH_4$ gas and the $NH_3$ gas to the $N_2O$ gas may be about 0.8:1 or less.

Figure 2G:
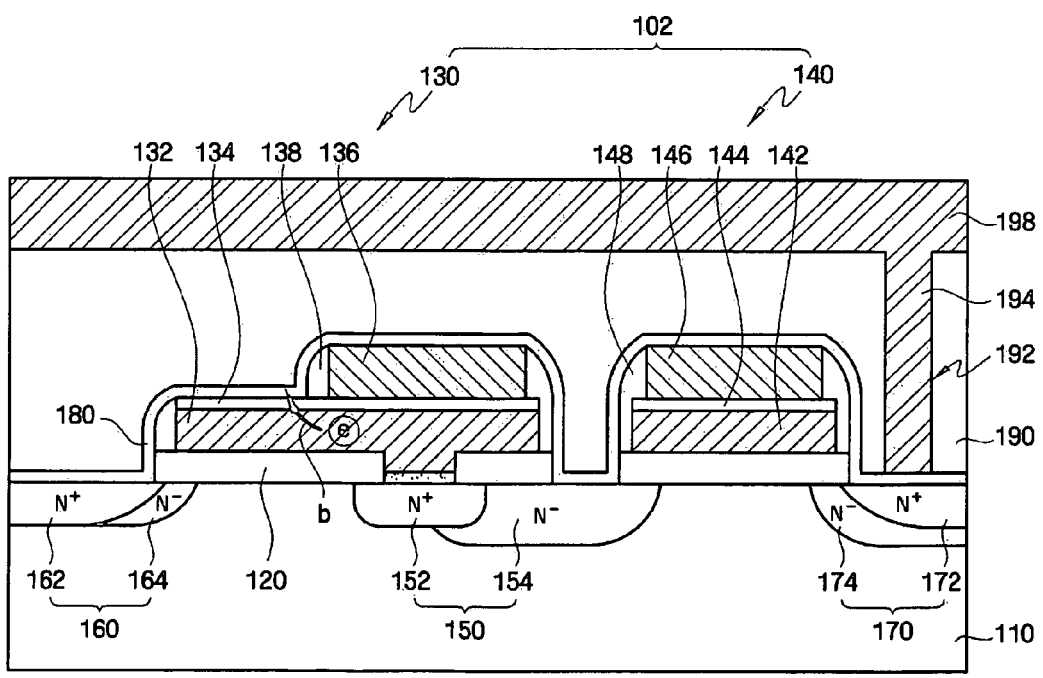

Referring to FIG. 2G, a gate-to-metal interlayer 190 is formed on the semiconductor substrate 110, and a predetermined region of the gate-to-metal interlayer 190 is dry-etched to form a contact hole 192. When the predetermined region of the gate-to-metal interlayer 190 is dry-etched, the SiON layer 180 serves as an antireflective layer and/or an etch stop layer. Then, a conductive material such as metal is deposited and patterned so that the contact hole 192 is sufficiently filled to thereby form a bit line contact 194 and a bit line 198.

As shown in FIG. 2G, a semiconductor memory device according to another exemplary embodiment of the present invention includes a semiconductor substrate 110, a cell transistor 102, a SiON layer 180, a gate-to-metal interlayer 190, and a bit line 198. Here, the cell transistor 102 includes a memory transistor 130 and a select transistor 140.

The SiON layer 180 is formed on the cell transistor 102, and used as an antireflective layer and/or an etch stop layer. The SiON layer 180 has a refractive index (RI) of about 1.8 or less, and may have a Si—H bond content of about 5% or less. Thus, the attraction of electrons stored in the floating gate 132 to the SiON layer 180 is reduced (see arrow b of FIG. 2G). Therefore, leakage current decreases and the retention characteristics of the memory transistor 130 are enhanced.

The semiconductor memory device according to the exemplary embodiment shown in FIGS. 1A through 1G has been illustrated by a flash memory device and the semiconductor memory device according to the embodiment shown in FIGS. 2A through 2G has been illustrated by an EEPROM device.

However, it is apparent to those of ordinary skill in the art that the exemplary embodiments of the present invention could also be applied to other nonvolatile memory devices such as e.g., EPROM devices. Semiconductor memory devices according to the exemplary embodiments of the present invention exhibit enhanced retention characteristics.

Hereinafter, the present invention will be described more specifically with reference to the following experimental examples and comparative experimental examples.

<Evaluation of Characteristics of SiON Layers>

EXPERIMENTAL EXAMPLE 1

$SiH_4$, $N_2O$, and $NH_3$ gases were supplied onto a blanket semiconductor substrate at a flow rate of 50 sccm, 120 sccm, and 30 sccm, respectively, at 400° C. under a process atmosphere of 2 Torr, to form a SiON layer. That is, the flow-rate ratio of the $SiH_4$ gas to the $N_2O$ gas was 0.40:1, and the flow-rate ratio of a mixed gas of the $SiH_4$ gas and the $NH_3$ gas to the $N_2O$ gas was 0.66:1.

COMPARATIVE EXPERIMENTAL EXAMPLE 1

$SiH_4$, $N_2O$, and $NH_3$ gases were supplied onto a blanket semiconductor substrate at a flow rate of 130 sccm, 120 sccm, and 100 sccm, respectively, at 400° C. under a process atmosphere of 2 Torr, to form a SiON layer. That is, the flow-rate ratio of the $SiH_4$ gas to the $N_2O$ gas was 1.10:1, and the flow-rate ratio of a mixed gas of the $SiH_4$ gas and the $NH_3$ gas to the $N_2O$ gas was 1.91:1.

The characteristics of the SiON layers of Experimental Example 1 and Comparative Experimental Example 1 are presented in Table 1 below.

TABLE 1

| Item | Experimental Example 1 | Comparative Experimental Example 1 | Remark |
|---|---|---|---|
| Ratio of $SiH_4$ to $N_2O$ | 0.40:1 | 1.1:1 | |
| Refractive index (RI) | 1.63 | 2.02 | 670 nm |
| Wet-etch rate | 900 Å | 220 Å | LAL200, 30 sec |
| Dry-etch rate | 2200 Å | 1350 Å | C4F8 |
| Selectivity ratio for oxide layer | 8:1 | 14:1 | |

Referring to Table 1, at a wavelength of 670 nm, the refractive index of the SiON layer of Experimental Example 1 was 1.63, and the refractive index of the SiON layer of Comparative Experimental Example 1 was 2.02. This shows that the SiON layer of Comparative Experimental Example 1 is denser than the SiON layer of Experimental Example 1. In this regard, when the two SiON layers were subjected to wet-etching using a LAL200 solution for 30 seconds and to dry-etching using C4F8 as an etching gas, the etch rate of the SiON layer of Experimental Example 1 was higher than that of Comparative Experimental Example 1. In addition, the refractive index of the SiON layer of Experimental Example 1 was 1.63 which was close to that (1.46) of an oxide layer. Thus, the SiON layer of Experimental Example 1 exhibited a lower selectivity ratio for an oxide layer than that of Comparative Experimental Example 1. Even though the SiON layer of Experimental Example 1 exhibits a relatively low selectivity ratio for an oxide layer, it is suitable to be used as an etch stop layer.

<Evaluation of Characteristics of Semiconductor Memory Devices Including SiON Layers>

EXPERIMENTAL EXAMPLE 2

A cell transistor of a split gate-type flash memory device was formed on a semiconductor substrate, and a SiON layer was formed to a thickness of 400 Å on the cell transistor. Here, the SiON layer was formed using the same process conditions as in Experimental Example 1. Then, a gate-to-metal interlayer, a bit line contact, and a bit line were sequentially formed to complete a test semiconductor memory device.

EXPERIMENTAL EXAMPLE 3

A cell transistor of a split gate-type flash memory device was formed on a semiconductor substrate, and a SiON layer was formed to a thickness of 400 Å on the cell transistor. Here, the SiON layer was formed by supplying $SiH_4$, $N_2O$, and $NH_3$ gases at a flow rate of 50 sccm, 300 sccm, and 100 sccm, respectively, at 400° C. under a process atmosphere of 2 Torr. That is, the flow-rate ratio of the $SiH_4$ gas to the $N_2O$ gas was 0.16:1, and the flow-rate ratio of a mixed gas of the $SiH_4$ gas and the $NH_3$ gas to the $N_2O$ gas was 0.50:1. Then, a gate-to-metal interlayer, a bit line contact, and a bit line were sequentially formed to complete a test semiconductor memory device.

COMPARATIVE EXPERIMENTAL EXAMPLE 2

A cell transistor of a split gate-type flash memory device was formed on a semiconductor substrate, and a SiON layer was formed to a thickness of 400 Å on the cell transistor. Here, the SiON layer was formed using the same process conditions as in Comparative Experimental Example 1. Then, a gate-to-metal interlayer, a bit line contact, and a bit line were sequentially formed to complete a test semiconductor memory device.

The bonds in the SiON layers of the test semiconductor memory devices of Comparative Experimental Example 2 and Experimental Example 3 were analyzed by a FTIR method. The results are shown in FIG. 3.

Figure 4:
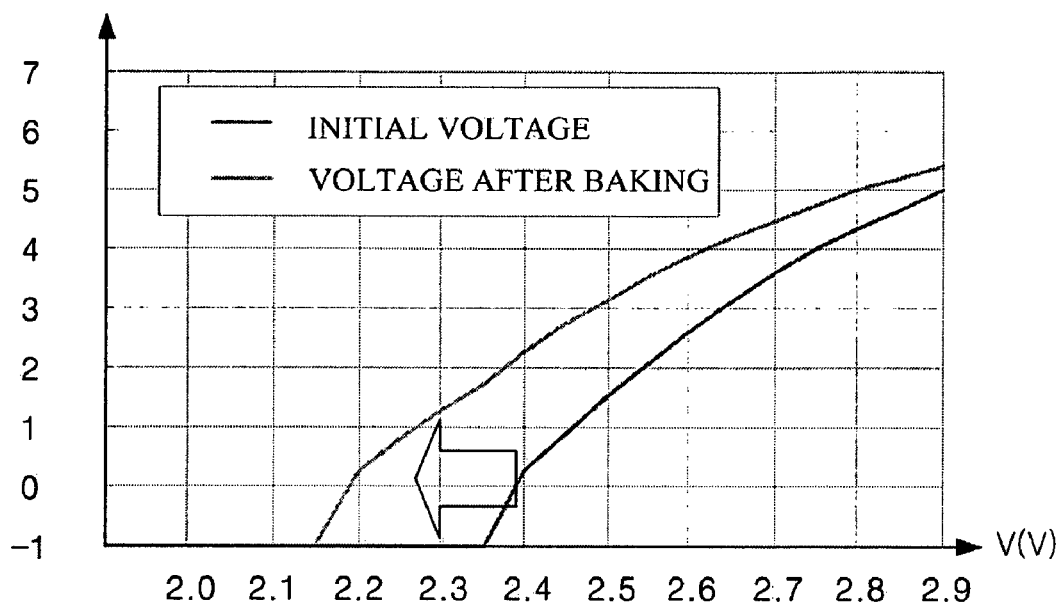
FIG. 4 is a view illustrating current with respect to a voltage read after programming a conventional semiconductor memory device.
Figure 5:
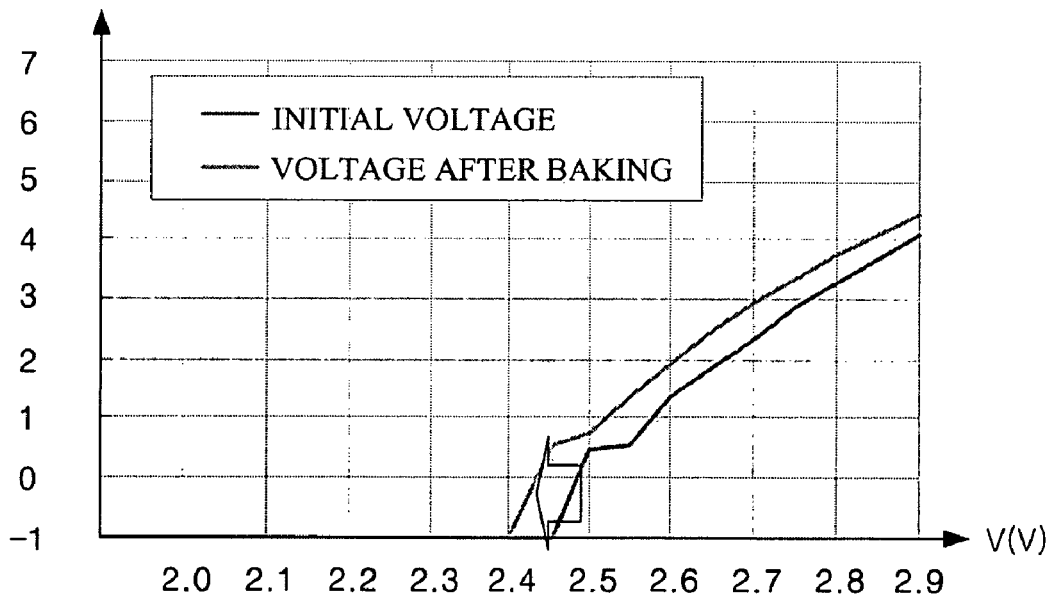
FIGS. 5 and 6 are views illustrating current with respect to a voltage read after programming semiconductor memory devices.
Figure 6:
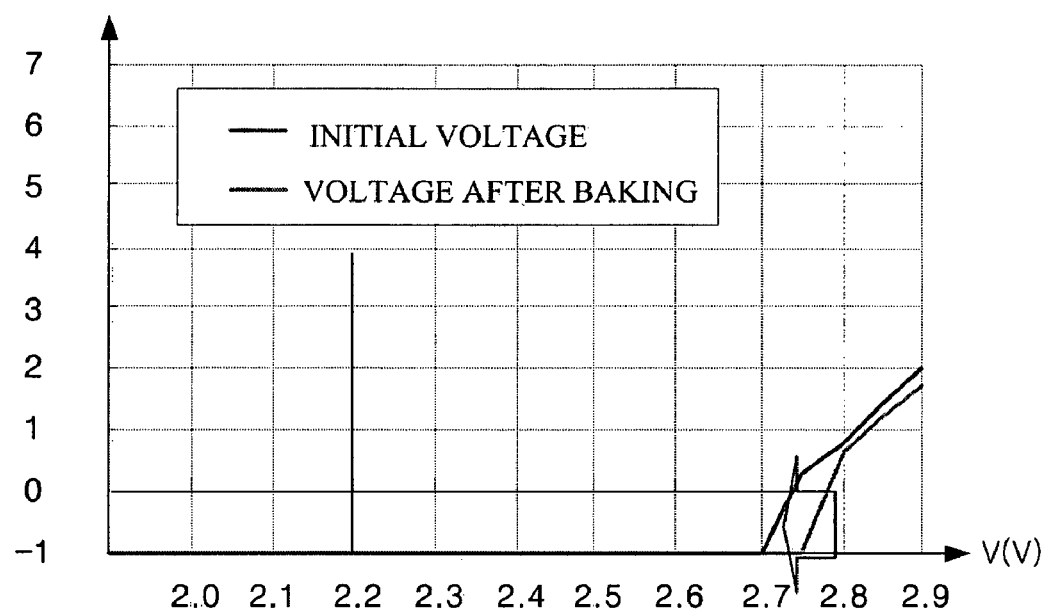

Reading of voltage and current levels was done after programming the test semiconductor memory devices of Comparative Experimental Example 2, and Experimental Examples 2 and 3. In addition, the reading of voltage and current levels was done after baking the test semiconductor memory devices of Comparative Experimental Example 2, and Experimental Examples 2 and 3 at about 150° C. The results are shown in FIGS. 4 through 6 and presented in Table 2 below.

Here, during programming, a high voltage of about 10 V was applied to a source region and a ground voltage was applied to a drain region. To decrease current flow during programming, a voltage slightly higher than the threshold voltage, i.e., about 1.8 V which was a gate turn-on voltage, was applied to a control gate. During reading, a ground voltage was applied to the source region, 1 V was applied to the drain region, and 1.8 V was applied to the control gate. The voltages applied to the source region and the drain region can also be switched.

TABLE 2

| Test sample | Refractive index (RI) | $SiH_4$:$N_2O$ Ratio | Initial voltage (V) | Voltage after baking (V) | Voltage difference |
|---|---|---|---|---|---|
| Experimental Example 2 | 1.63 | 0.40:1 | 2.49 | 2.41 | 0.08 |
| Experimental Example 3 | 1.49 | 0.16:1 | 2.75 | 2.71 | 0.04 |
| Comparative Experimental Example 2 | 2.02 | 1.10:1 | 2.32 | 2.13 | 0.19 |

First, referring to FIG. 3, the x-axis represents wavelength ($cm^{-1}$) and the y-axis represents absorbance. The Si—H bond content of Experimental Example 3 was smaller than that of Comparative Experimental Example 2. In particular, the ratio of Si—H bond to Si—O bond of Experimental Example 3 was about 3%. In addition, the ratio of Si—H bond to Si—O bond of Experimental Example 2 was about 5%.

Referring to FIGS. 4 through 6 and Table 2, the x-axis represents voltage (V) and the y-axis represents standardized current (A). The x-intercepts of the graphs of FIGS. 4 through 6 are represented by the initial voltage (V) and the voltage (V) after baking in Table 2. In Comparative Experimental Example 2, a voltage difference before and after baking was 0.19 V. On the other hand, the voltage difference of Experimental Examples 2 and 3 was 0.08 V and 0.04 V, respectively. That is, the voltage difference of Experimental Examples 2 and 3 was smaller than that of Comparative Experimental Example 2.

As described above, Si—H bonds are readily dissociated even at low temperature, yielding ion species attracting charges. Thus, ion species dissociated from Si—H bonds at about 150° C. attract electrons stored in a floating gate, thereby inducing a difference in voltage during reading. In this regard, the initial voltage and voltage difference percentage of a semiconductor memory device are defined as the standards in conformity with the specification to then be used for evaluation of rating (goodness/badness) of a semiconductor memory device produced. The voltage difference percentage defined as the standards in conformity with the specification may vary within a range from about 5 to about 10% according to e.g., the type of semiconductor memory device and the baking temperature,. Thus, assuming that an initial voltage is about 2.5 V in the above experimental examples, a voltage difference of 5% corresponds to about 0.125 V. In this respect, the test semiconductor memory devices of Experimental Examples 2 and 3 are regarded as good products since a voltage difference is less than 0.125 V, whereas the test semiconductor memory device of Comparative Experimental Example 2 is regarded as a poor product.

Meanwhile, based upon a linear relationship between the voltage difference and the refractive index, the refractive index corresponding to the voltage difference of 0.125 V is about 1.8. Thus, when the refractive index is 1.8 or less, the spec for the voltage difference can be adjusted.

The semiconductor memory device and the method of manufacturing the semiconductor memory device according to the exemplary embodiments of the present invention provides the following benefits:

First, a SiON layer with refractive index of about 1.8 or less is used, thereby reducing leakage current. That is, the retention characteristics of electrons stored in a cell transistor of the semiconductor memory device are enhanced.

Second, a semiconductor memory device in which the reliability of the device is also enhanced.

Having described the exemplary embodiments of the present invention, it is further noted that it is readily apparent to those of reasonable skill in the art that various modifications may be made without departing from the spirit and scope of the invention which is defined by the metes and bounds of the appended claims.

What is claimed is:

1. A method of manufacturing a semiconductor memory device, the method comprising:
   providing a semiconductor substrate;
   forming a cell transistor on the semiconductor substrate, the cell transistor comprising a floating gate formed on the semiconductor substrate, a control gate formed above the floating gate and overlapping a portion of the floating gate and a source region formed in the semiconductor substrate, and wherein the source region is aligned to a sidewall of the floating gate that does not overlap with the control gate electrode;
   forming a silicon oxynitride (SiON) layer with a refractive index of about 1.8 or less conformally on the floating gate and the semiconductor substrate and directly on a top surface of the control gate of the cell transistor; and
   forming a gate to metal interlayer on the SiON layer.

2. The method of claim 1, wherein a ratio of Si—H bond to Si—O bond in the SiON layer is about 5% or less.

3. The method of claim 1, wherein in forming the SiON layer, a $SiH_4$ gas and a $N_2O$ gas are supplied onto the semiconductor substrate.

4. The method of claim 3, wherein a flow-rate ratio of the $SiH_4$ gas to the $N_2O$ gas is less than about 0.5:1.

5. The method of claim 4, wherein a flow rate of the $SiH_4$ gas is about 30 to about 100 standard cubic centimeters per minute (sccm).

6. The method of claim 3, wherein in forming the SiON layer, a $NH_3$ gas is further supplied onto the semiconductor substrate.

7. The method of claim 6, wherein a flow-rate ratio of the $SiH_4$ gas to the $N_2O$ gas is less than about 0.5:1, and a flow rate ratio of mixed gas of the $SiH_4$ gas and the $NH_3$ gas to the $N_2O$ gas is less than about 0.8:1.

8. The method of claim 7, wherein the flow rate of the $SiH_4$ gas is about 30 to about 100 sccm.

9. The method of claim 6, wherein in forming the SiON layer, a $N_2$ gas is further supplied onto the semiconductor substrate.

10. The method of claim 1, wherein the cell transistor is a cell transistor of a nonvolatile memory device.

11. The method of claim 1, wherein the gate-to-metal interlayer is dry etched and the SiON layer is used as an etch stop layer and an antireflective layer.

12. The method of claim 1, further comprising:
    etching a region of the gate to metal interlayer to form a contact hole; and
    filling the contact hole to form a bit line contact and a bit line.

13. A semiconductor memory device comprising:
    a semiconductor substrate;

a cell transistor formed on the semiconductor substrate, the cell transistor comprising a floating gate formed on the semiconductor substrate, a control gate formed above the floating gate and overlapping a portion of the floating gate and a source region formed in the semiconductor substrate, and wherein the source region is aligned to a sidewall of the floating gate that does not overlap with the control gate electrode;

a SiON layer, formed conformally on the floating gate and the semiconductor substrate and directly on a top surface of the control gate of the cell transistor, having a refractive index of about 1.8 or less; and a gate to metal interlayer located on the SiON layer.

14. The semiconductor memory device of claim 13, wherein a ratio of Si—H bond to Si—O bond in the SiON layer is about 5% or less.

15. The semiconductor memory device of claim 13, wherein the cell transistor is a cell transistor of a nonvolatile memory device and a gate of the cell transistor is covered with the SiON layer.

16. The semiconductor memory device of claim 13, further comprising:
a bit line contact and a bit line, said bit line contact and said bit line are formed of a conductive material filled within an etched portion of the gate to metal interlayer.

17. A method of manufacturing a semiconductor memory device, the method comprising:
providing a semiconductor substrate;
forming a cell transistor on the semiconductor substrate, the cell transistor comprising a memory transistor and a select transistor, wherein the memory transistor of the cell transistor comprising a floating gate formed on the semiconductor substrate, a sense line formed above the floating gate and overlapping a portion of the floating gate and a source region formed in the semiconductor substrate, and wherein the source region is aligned to a sidewall of the floating gate that does not overlap with the sense line;
forming a silicon oxynitride (SiON) layer with a refractive index of about 1.8 or less conformally on the floating gate and the semiconductor substrate and directly on a top surface of the sense line of the cell transistor; and
forming a gate to metal interlayer on the SiON layer.

18. A semiconductor memory device comprising:
a semiconductor substrate;
a cell transistor formed on the semiconductor substrate, the cell transistor comprising a memory transistor and a select transistor, wherein the memory transistor of the cell transistor comprising a floating gate formed on the semiconductor substrate, a sense line formed above the floating gate and overlapping a portion of the floating gate and a source region formed in the semiconductor substrate, and wherein the source region is aligned to a sidewall of the floating gate that does not overlap with the sense line;
a SiON layer, formed conformally on the floating gate and the semiconductor substrate and directly on a top surface of the sense line of the cell transistor, having a refractive index of about 1.8 or less; and
a gate to metal interlayer located on the SiON layer.

* * * * *